US010439850B2

(12) United States Patent
Heck et al.

(10) Patent No.: US 10,439,850 B2
(45) Date of Patent: Oct. 8, 2019

(54) SYSTEM AND METHOD FOR PROCESSING RADIOFREQUENCY SIGNALS USING MODULATION DUTY CYCLE SCALING

(71) Applicant: MOTOROLA SOLUTIONS, INC., Chicago, IL (US)

(72) Inventors: Joseph P. Heck, Ft. Lauderdale, FL (US); Christopher Calvo, Davie, FL (US); Rodger W. Caruthers, Des Plaines, IL (US); Nicholas G. Cafaro, Parkland, FL (US); Geetha B. Nagaraj, San Diego, CA (US); Raul Salvi, Boca Raton, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/660,723

(22) Filed: Jul. 26, 2017

(65) Prior Publication Data

US 2019/0036747 A1    Jan. 31, 2019

(51) Int. Cl.
| | |
|---|---|
| H04B 1/16 | (2006.01) |
| H04L 27/14 | (2006.01) |
| H03K 5/156 | (2006.01) |
| H04B 1/00 | (2006.01) |

(52) U.S. Cl.
CPC .......... H04L 27/14 (2013.01); H03K 5/1565 (2013.01); H04B 1/0007 (2013.01); H04B 1/16 (2013.01)

(58) Field of Classification Search
CPC ................................. H04L 27/14; H04B 1/16
USPC ....................... 455/295, 334, 337, 275, 276.1
See application file for complete search history.

(56) References Cited

U.S. PATENT DOCUMENTS

| | | | | |
|---|---|---|---|---|
| 5,835,850 | A * | 11/1998 | Kumar | H04B 17/15 |
| | | | | 455/67.14 |
| 6,487,398 | B1 * | 11/2002 | Nobbe | H04B 1/0475 |
| | | | | 375/295 |
| 7,020,451 | B2 | 3/2006 | Sugar et al. | |
| 7,532,867 | B1 | 5/2009 | Mo et al. | |
| 8,378,719 | B1 * | 2/2013 | Pace | H03K 23/66 |
| | | | | 327/115 |
| 8,498,602 | B2 | 7/2013 | Xu et al. | |
| 2010/0073102 | A1 * | 3/2010 | Singerl | H03F 3/217 |
| | | | | 332/108 |
| 2013/0115907 | A1 | 5/2013 | Theodoratos et al. | |
| 2014/0146761 | A1 | 5/2014 | Li et al. | |
| 2014/0194076 | A1 | 7/2014 | Hwang et al. | |
| 2014/0269865 | A1 * | 9/2014 | Aparin | H04L 27/0002 |
| | | | | 375/222 |

(Continued)

OTHER PUBLICATIONS

PCT/US2018/039802 International Search Report and Written Opinion of the International Searching Authority dated Oct. 5, 2018 (12 pages).

*Primary Examiner* — Sonny Trinh
(74) *Attorney, Agent, or Firm* — Michael Best & Friedrich LLP

(57) ABSTRACT

Systems and methods for processing radiofrequency signals using modulation duty cycle scaling. One system includes a first receive path configured to directly sample a first signal in a first frequency range. The system includes a second receive path configured to convert a second signal in a second frequency range. The second receive path includes a receive modulator operating over a duty cycle. The receive modulator is configured to adjust the duty cycle by a predetermined scaling factor.

18 Claims, 2 Drawing Sheets

(56) References Cited

U.S. PATENT DOCUMENTS

2015/0195059 A1* 7/2015 Strau nigg ........... H04B 1/0483
                                                    375/295
2015/0223076 A1    8/2015 Santhoff
2015/0256207 A1    9/2015 Liao et al.

* cited by examiner

SYSTEM AND METHOD FOR PROCESSING RADIOFREQUENCY SIGNALS USING MODULATION DUTY CYCLE SCALING

BACKGROUND OF THE INVENTION

Some radio communication devices operate over a wide range of frequencies, from below 100 MHz up to 60 GHz. Some devices also operate using multiple inputs and outputs across multiple frequencies. Integrating hardware, for example, filters and signal processors, across multiple frequency ranges and with multiple inputs and outputs increases hardware complexity and cost.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
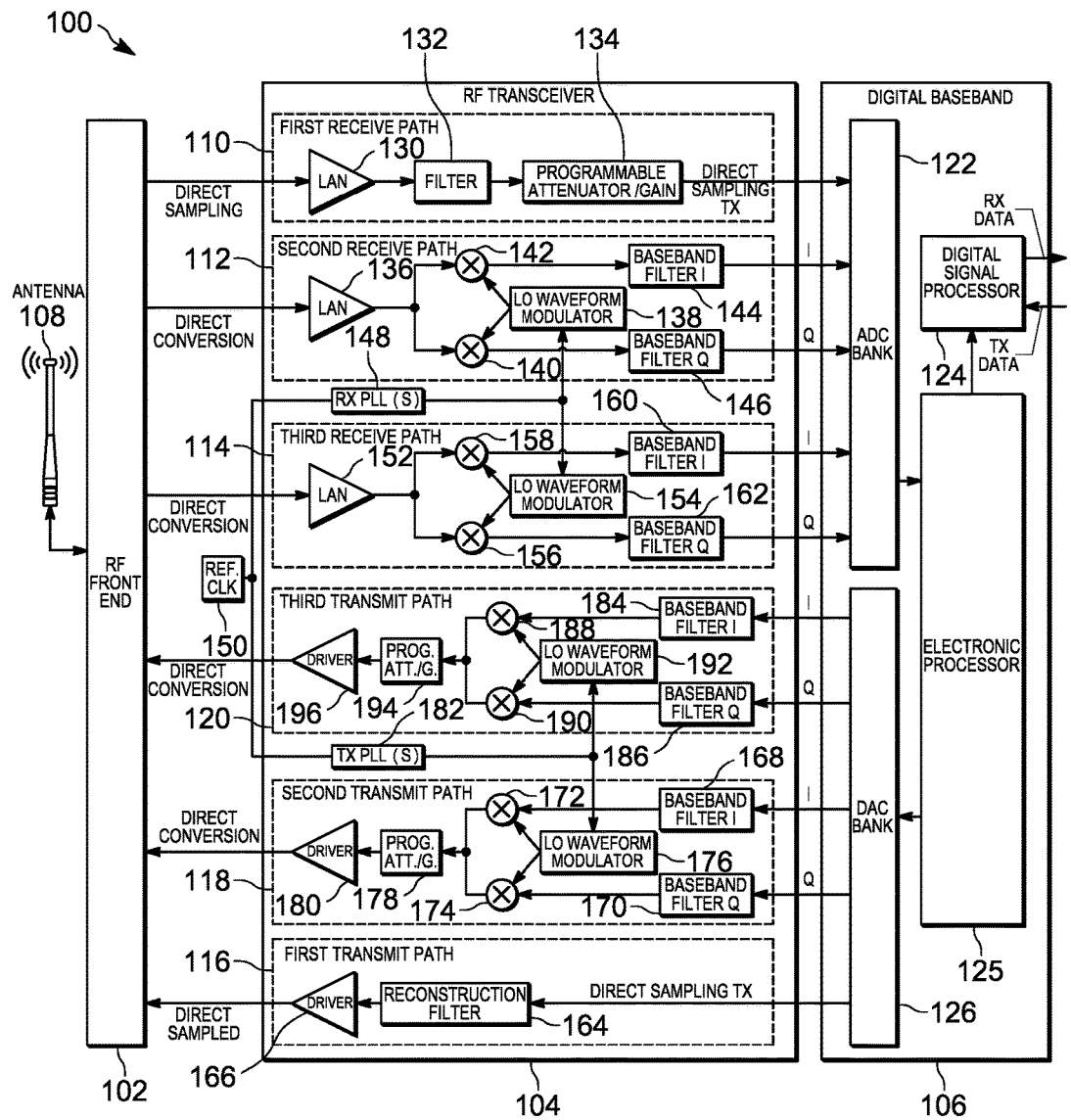
FIG. 1 is a diagram of a system for processing radiofrequency signals using modulation duty cycling, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Radio communication devices transmit and receive modulated radiofrequency signals using a broad range of operating frequencies, channel bandwidths, operating modes, and modulation waveforms. Frequencies may vary from below 100 MHz up to 60 GHz. Some devices use multiple inputs and outputs, multiple channels, and multiple operating modes. However, circuitry that works well processing signals in one frequency range may not work as well in another frequency range. For example, direct sampling offers high performance, but it is not effective at higher frequencies. In another example, direct conversion reduces filtering requirements, but a single direct conversion may not be as effective over a broad range of frequencies. Providing hardware implementations for each range requires many filters and signal processors, across multiple frequency ranges and with multiple inputs and outputs, which can increase hardware complexity, cost, and size. Accordingly, embodiments presented herein provide, among other things, a software defined transceiver architecture for processing radiofrequency signals using modulation or scaling of the mixer local oscillator (LO) waveform duty cycle.

One example embodiment provides a system for processing radiofrequency signals using modulation duty cycle scaling. The system includes a first receive path configured to directly sample a first signal in a first frequency range. The system includes a second receive path configured to convert a second signal in a second frequency range. The second receive path includes a receive modulator operating over a duty cycle. The receive modulator is configured to adjust the duty cycle by a predetermined scaling factor.

Another example embodiment provides a method for processing radiofrequency signals using modulation duty cycle scaling. The method includes directly sampling, with a first receive path, a first signal in a first frequency range. The method includes converting, with a second receive path including a receive modulator operating over a duty cycle, a second signal in a second frequency range. The method includes adjusting, with the receive modulator, the duty cycle by a predetermined scaling factor.

For ease of description, some or all of the example systems presented herein are illustrated with a single exemplar of each of its component parts. Some examples may not describe or illustrate all components of the systems. Other example embodiments may include more or fewer of each of the illustrated components, may combine some components, or may include additional or alternative components.

FIG. 1 is a diagram of an example system 100 for processing radiofrequency signals using modulation duty cycle scaling. In the embodiment illustrated, the system 100 includes a front end 102, a transceiver 104, and a digital processor 106. The front end 102 is communicatively coupled to an antenna 108 and the transceiver 104. The transceiver 104 is communicatively coupled to the front end 102 and the digital processor 106. The illustrated components of FIG. 1, along with other various modules and components are coupled to each other by or through one or more control or data buses that enable communication therebetween. The use of control and data buses for the interconnection between and exchange of information among the various modules and components would be apparent to a person skilled in the art in view of the description provided herein.

In some embodiments, the system 100 is a software defined transceiver, which may be integrated in to an electronic communications device, for example, a portable radio, a cellular telephone, a tablet computer, and the like.

The front end 102 may include various digital and analog components, which for brevity are not described herein and which may be implemented in hardware, software, or a combination of both, including one or more radiofrequency filters, signal splitters, signal switches, signal combiners, transmit power amplifiers, and the like (not shown). The front end 102 receives radiofrequency signals from the antenna 108, optionally filters the signals, and passes them to the transceiver 104. Likewise, the front end 102 receives radiofrequency signals from the transceiver 104, optionally filters the signals, and transmits them via the antenna 108.

The transceiver 104 receives modulated radiofrequency signals (for example, a carrier frequency signal modulated with a baseband signal) from the antenna 108, via the front end 102. The transceiver 104 demodulates the modulated radiofrequency signal using one or more of a first receive path 110, a second receive path 112, and a third receive path 114 to extract the baseband signal. The transceiver 104 communicates the extracted analog baseband signal to the analog-to-digital converters (ADCs) in the digital processor 106. The transceiver 104 receives a baseband signal from the digital processor 106 and modulates the baseband signal with a carrier signal using one or more of a first transmit path 116, a second transmit path 118, and a third transmit path 120 to produce a modulated radiofrequency signal. The transceiver 104 transmits the modulated radiofrequency signal via the front end 102 and the antenna 108.

As described more particularly below, the first receive path 110, the second receive path 112, and the third receive path 114, the first transmit path 116, the second transmit path 118, and the third transmit path 120 are each configured to receive and process signals for a particular frequency or range of frequencies. In some embodiments, the first receive path 110 and the first transmit path 116 are configured to process signals having a frequency in a low range (for example, below 500 MHz). In some embodiments, the second receive path 112 and the second transmit path 118 are configured to process signals having a frequency in a medium range (for example, between 100 MHz and 6,000 MHz). In some embodiments, the third receive path 114 and the second transmit path 120 are configured to process signals having a frequency in a high (or microwave) range (for example, between 5 GHz and 60 GHz).

The first receive path 110 includes an amplifier 130 (for example, a low-noise amplifier), a filter 132 (for example, an LC filter), and a programmable attenuator/gain stage 134. The components of the first receive path 110 are configured to receive and process radiofrequency signals using direct sampling. Through direct sampling, the first receive path 110 digitizes the received analog signals directly without frequency translation.

The second receive path 112 includes an amplifier 136 (for example, a low noise amplifier), a LO waveform modulator 138 (for example, a quadrature generator), a mixer 140, a mixer 142, an in-phase baseband filter 144, and a quadrature baseband filter 146. The components of the second receive path 112 are configured to receive and process modulated radiofrequency signals using direct conversion, which converts the modulated radiofrequency signals to analog baseband in-phase and quadrature signals without first converting them to an intermediate frequency. The LO waveform modulator 138 is driven by a phase-locked-loop (PLL) which may be one of a set of one or more synchronized phase-locked loops 148, which are clocked with a reference clock 150. The LO waveform modulator 138 and the mixer 140 demodulate the quadrature baseband signal from the received modulated radiofrequency signal and feed it to the quadrature baseband filter 146. The LO waveform modulator 138 and the mixers 142 and 140 demodulate the in-phase and quadrature baseband signals from the received modulated radiofrequency signal and feed them to the in-phase and quadrature baseband filters 144 and 146. As described more particularly below, the duty cycle of the LO waveform modulator 138 is scalable based on the frequency of the received modulated radiofrequency signal. The in-phase baseband filter 144 and the quadrature baseband filter 146 filter their respective signals to filter out frequencies not in the range of the baseband signals appropriate to the carrier frequency range, and pass the filtered signals to the digital processor 106 for decoding.

The third receive path 114 includes an amplifier 152, a LO waveform modulator 154, a mixer 156, a mixer 158, an in-phase baseband filter 160, and a quadrature baseband filter 162. The components of the third receive path 114 are configured and operate similarly to their counterparts in the second receive path 112. As with the second receive path 112, the duty cycle of the LO waveform modulator 154 is scalable based on the frequency of the received modulated radiofrequency signal.

The first transmit path 116 includes a reconstruction filter 164 and a driver 166 (for example, an amplifier). The components of the first transmit path 116 are configured to receive a baseband signal from a digital-to-analog converter (DAC) in the digital processor 106 and use direct sampling to transmit the baseband signal on a carrier signal.

The second transmit path 118 includes an in-phase baseband filter 168, a quadrature baseband filter 170, a mixer 172, a mixer 174, a LO waveform modulator 176 (for example, a quadrature generator), a programmable attenuator 178, and a driver 180 (for example, an amplifier). The components of the second transmit path 112 are configured to receive baseband signals from DACs in the digital processor 106 and modulate the baseband signals with a carrier signal to produce modulated radiofrequency signals using direct conversion. The LO waveform modulator 176 is driven by a PLL which may be one of a set of one or more synchronized phase-locked loops 182, which are clocked with a reference clock 150. The in-phase baseband filter 168 receives a baseband signal from a DAC in the digital processor 106, filters the signal, and feeds it to the mixer 172. Likewise, the quadrature baseband filter 170 receives a second baseband signal from a DAC in the digital processor 106, filters the signal, and feeds it to the mixer 174. The in-phase baseband filter 168 and the quadrature baseband filter 170 filter their respective signals to filter out frequencies not in the range of the baseband signals appropriate to the carrier frequency range. The two signals are combined, modulated with the carrier signal, and fed to the programmable attenuator 178, which suitably attenuates the modulated radiofrequency signal. The attenuated signal is fed to the driver 180 for transmission via the front end 102 and the antenna 108. As described more particularly below, the duty cycle of the LO waveform LO waveform modulator 176 is scalable based on the frequency of the modulated radiofrequency signal.

The third transmit path 120 includes an in-phase baseband filter 184, a quadrature baseband filter 186, a mixer 188, a mixer 190, a LO waveform modulator 192 (for example, a quadrature generator), a programmable attenuator 194, and a driver 196 (for example, an amplifier). The components of the third transmit path 120 are configured and operate similarly to their counterparts in the second transmit path 118. As with the second transmit path 118, the duty cycle of the LO waveform LO waveform modulator 192 is scalable based on the frequency of the received modulated radiofrequency signal.

In some embodiments, components may be shared between transmit and receive paths. For example, one set of baseband filters may be provided, which filters can be switched between the receive and transmit paths.

In some embodiments, the transceiver 104 includes more or fewer transmit and receive paths than those illustrated in FIG. 1.

The digital processor 106 receives the extracted baseband signals from the transceiver 104, and decodes the baseband signal into received data using an analog-to-digital converter bank 122, a digital signal processor 124, and an electronic processor 125 (for example, a field programmable gate array (FPGA)). The received data is communicated to electronic elements outside the system 100, for example, the electronic processor (not shown) of a portable communications device (for example, a portable radio, smart telephone, and the like). In some embodiments, the system 100 may be integrated into such a portable communications device. The digital processor 106 also receives data from electronic elements outside the system 100, for example, the aforementioned electronic processor. The digital processor 106 encodes the data into a baseband signal, using the digital signal processor 124, the electronic processor 125, and a digital-to-analog converter bank 126. The encoded baseband signal is communicated to the transceiver 104 for modulation and transmission, as noted above.

Figure 2:
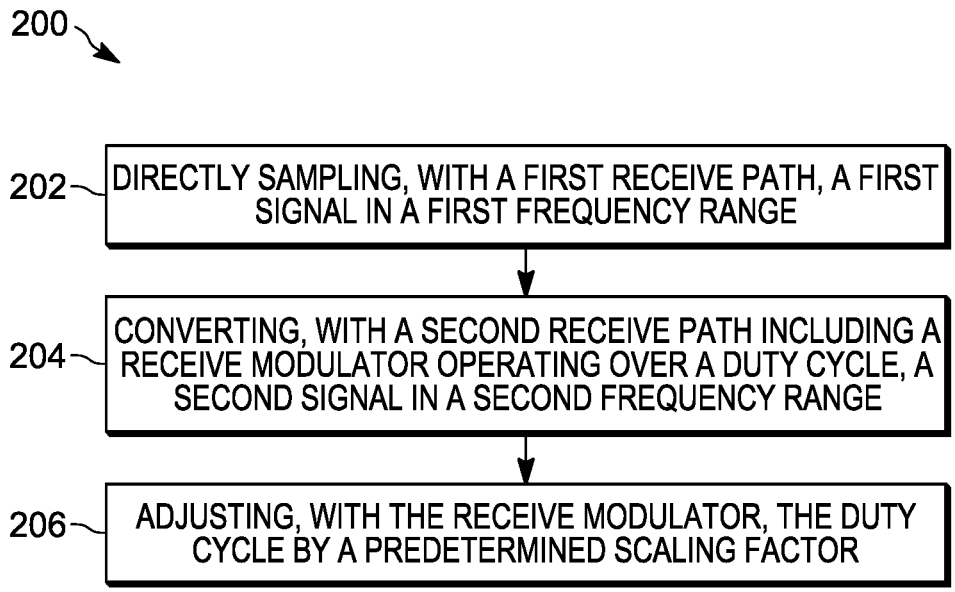
FIG. 2 is a flowchart of a method for receiving radiofrequency signals, in accordance with some embodiments.

In some embodiments, the electronic processor 125 is communicatively coupled to the transceiver 104 and configured to control the components of the transceiver 104 as described herein. For example, in some embodiments, the electronic processor is configured to implement a method 200, as illustrated in FIG. 2, for processing radiofrequency signals. As block 202, the electronic processor controls the first receive path 110 to directly sample a first signal in a first frequency range. As noted above, in some embodiments, the different paths are used to process signals in different frequency ranges. In some embodiments, the frequency range for the first receive path is determined based on the minimum sample rate of the sample rate of the data converters in the analog-to-digital converter bank 122. Higher sample rates increase the frequency range. By using the analog-to-digital converter bank 122 and direct sampling in the first frequency range, less hardware is required in the transceiver 104 as compared to some prior devices. In some embodiments, the first frequency range may span from DC to 500 MHz.

At block 204, the electronic processor 125 controls the second receive path 112 to convert a second signal in a second frequency range. The second frequency is generally higher than the first frequency range, and may overlap with the first frequency range on the lower end. In some embodiments, the second frequency range may span from 100 MHz to 6 GHz. In some embodiments, the second receive path 112 operates using direct conversion, as described above. Optionally, some embodiments of the second receive path 112 operate using heterodyne conversion. A second receive path 112 includes a receive modulator (for example, the LO waveform modulator 138), which operates over a duty cycle.

As noted above, the duty cycle is scalable. Scaling, or adjusting, the duty cycle improves the performance of the direct conversion. Accordingly, at block 206, the electronic processor 125 controls the modulator 128 to adjust the duty cycle by a predetermined scaling factor. In some embodiments, the predetermined scaling factor is 50%/N, where N is an even integer based on the frequency range. For example, for frequencies up to about 2 GHz, the third and fifth harmonic responses are suppressed when the duty cycle is set to 12.5%. In another example, for frequencies up to about 6 GHz, the noise and distortion performance are improved when the duty cycle is set to 25%. In another example, for frequencies above about 6 GHz, the performance may be improved when the duty cycle is set to 50%. Accordingly, the direct conversion performance can be improved by setting the duty cycle based on the frequency range. Suppressing the third and fifth harmonics also simplifies the filter requirements for the front end 102.

In some embodiments, additional receive paths (for example, the third receive path 114) may be used. In such embodiments, each receive path may be tuned for a particular frequency range with the duty cycle adjusted accordingly to improve performance over that frequency range.

Figure 3:
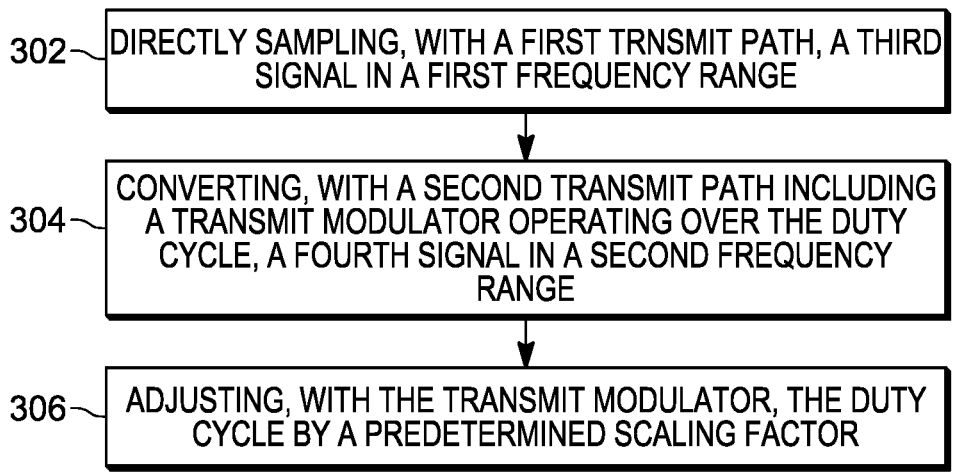
FIG. 3 is a flowchart of a method for transmitting radiofrequency signals, in accordance with some embodiments.

Using certain methods described herein, performance may also be improved for signal transmission. For example, FIG. 3 illustrates a method 300 for processing radiofrequency signals. As block 302, the electronic processor controls the first transmit path 110 to directly sample a third signal in the first frequency range. As with the receive paths, in some embodiments, the different transmit paths are used to process signals in different frequency ranges. In some embodiments, the frequency range for the first transmit path is determined based on the sample rate of the sample rate of the data converters in the digital-to-analog converter bank 126.

At block 304, the electronic processor 125 controls the second transmit path 118 to convert a fourth signal in the second frequency range. In some embodiments, the second transmit path 118 operates using direct conversion, as described above. Optionally, some embodiments of the second transmit path 118 operate using heterodyne conversion. A second transmit path 118 includes a transmit modulator (for example, the LO waveform modulator 176), which operates over the duty cycle.

As with the receive paths, the duty cycle is scalable. Accordingly, at block 306, the electronic processor 125 controls the LO waveform modulator 176 to adjusting the duty cycle by a predetermined scaling factor, as described above with respect to the method 200.

In some embodiments, additional transmit paths (for example, the third transmit path 114) may be used. In such embodiments, each transmit path may be tuned for a particular frequency range with the duty cycle adjusted accordingly to improve performance over that frequency range.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 20%, in another embodiment within 10%, in another embodiment within 2% and in another embodiment within 1%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A system for processing radiofrequency signals, the system comprising:
   a first receive path configured to directly sample a first radiofrequency signal in a first frequency range;
   a second receive path configured to convert a second radiofrequency signal in a second frequency range, the second receive path including a receive modulator operating over a duty cycle;
   wherein the receive modulator is configured to adjust the duty cycle by a predetermined scaling factor;
   a first transmit path configured to directly sample and transmit a third radiofrequency signal in the first frequency range;
   a second transmit path configured to convert and transmit a fourth radiofrequency signal in the second frequency range, the second transmit path including a transmit modulator operating over the duty cycle; and
   wherein the transmit modulator is configured to adjust the duty cycle by the predetermined scaling factor.

2. The system of claim 1, wherein the receive modulator is a quadrature generator.

3. The system of claim 1, wherein the second receive path is configured to convert the second radiofrequency signal via direct conversion.

4. The system of claim 1, wherein the second receive path is configured to convert the second radiofrequency signal via heterodyne conversion.

5. The system of claim 1, wherein the predetermined scaling factor is 50%/N, where N is an even integer based on the second frequency range.

6. The system of claim 1, wherein the transmit modulator is a quadrature generator.

7. The system of claim 1, wherein the second transmit path is configured to convert the fourth radiofrequency signal via direct conversion.

8. The system of claim 1, wherein the second transmit path is configured to convert the fourth radiofrequency signal via heterodyne conversion.

9. The system of claim 1, wherein the predetermined scaling factor is 50%/N, where N is an even integer based on the second frequency range.

10. A method for processing radiofrequency signals, the method comprising:
    directly sampling, with a first receive path, a first radiofrequency signal in a first frequency range;
    converting, with a second receive path including a receive modulator operating over a duty cycle, a second radiofrequency signal in a second frequency range;
    adjusting, with the receive modulator, the duty cycle by a predetermined scaling factor;
    directly sampling, with a first transmit path, a third radiofrequency signal in a first frequency range;
    converting, with a second transmit path including a transmit modulator operating over the duty cycle, a fourth radiofrequency signal in a second frequency range; and
    adjusting, with the transmit modulator, the duty cycle by a predetermined scaling factor.

11. The method of claim 10, wherein adjusting the duty cycle with the receive modulator includes adjusting the duty cycle with a quadrature generator.

12. The method of claim 10, wherein converting the second radiofrequency signal includes converting the second signal via direct conversion.

13. The method of claim 10, wherein converting the second radiofrequency signal includes converting the second signal via heterodyne conversion.

14. The method of claim 10, wherein adjusting, with the receive modulator, the duty cycle by a predetermined scaling factor includes adjusting the duty cycle by 50%/N, where N is an even integer based on the second frequency range.

15. The method of claim 10, wherein adjusting the duty cycle with the transmit modulator includes adjusting the duty cycle with a quadrature generator.

16. The method of claim 10, wherein converting the fourth radiofrequency signal includes converting the fourth signal via direct conversion.

17. The method of claim 10, wherein converting the fourth radiofrequency signal includes converting the fourth signal via heterodyne conversion.

18. The method of claim 10, wherein adjusting, with the transmit modulator, the duty cycle by a predetermined scaling factor includes adjusting the duty cycle by 50%/N, where N is an even integer based on the second frequency range.

\* \* \* \* \*

UNITED STATES PATENT AND TRADEMARK OFFICE
CERTIFICATE OF CORRECTION

PATENT NO. : 10,439,850 B2  
APPLICATION NO. : 15/660723  
DATED : October 8, 2019  
INVENTOR(S) : Heck et al.

Page 1 of 1

It is certified that error appears in the above-identified patent and that said Letters Patent is hereby corrected as shown below:

In the Claims

At Column 8, Line 46 in Claim 10:
"radio-frequency signal in a first frequency range" should read --radiofrequency signal in the first frequency range--

At Column 8, Line 49 in Claim 10:
"radiofrequency signal in a first frequency range; and" should read --radiofrequency signal in the second frequency range; and--

Signed and Sealed this  
Sixth Day of July, 2021

Drew Hirshfeld  
*Performing the Functions and Duties of the*  
*Under Secretary of Commerce for Intellectual Property and*  
*Director of the United States Patent and Trademark Office*